US012777871B2

(12) United States Patent
Sirkis et al.

(10) Patent No.: US 12,777,871 B2
(45) Date of Patent: Oct. 27, 2026

(54) INCREASING Q-TIME

(71) Applicant: Tower Semiconductor Ltd., Migdal Haemek (IL)

(72) Inventors: Alex Sirkis, Yokneam Illit (IL); Julian Guzman, Irvine, CA (US); Carlo Romano, Vedano al Lambro (IT); Simone Marchetti, Landriano (IT)

(73) Assignee: Tower Semiconductor Ltd., Migdal Haemek (IL)

(*) Notice: Subject to any disclaimer, the term of this patent is extended or adjusted under 35 U.S.C. 154(b) by 328 days.

(21) Appl. No.: 18/639,879

(22) Filed: Apr. 18, 2024

(65) Prior Publication Data

US 2025/0329528 A1 Oct. 23, 2025

(51) Int. Cl.

| | |
|---|---|
| ***H10P 70/00*** | (2026.01) |
| ***H10P 14/60*** | (2026.01) |
| ***H10P 14/694*** | (2026.01) |
| ***H10P 50/28*** | (2026.01) |
| ***H10P 90/00*** | (2026.01) |
| ***H10W 10/10*** | (2026.01) |
| ***H10W 20/48*** | (2026.01) |

(52) U.S. Cl.

CPC ........ *H10P 70/234* (2026.01); *H10P 14/6319* (2026.01); *H10P 14/69433* (2026.01); *H10P 50/283* (2026.01); *H10P 90/1906* (2026.01); *H10W 10/181* (2026.01); *H10W 20/48* (2026.01)

(58) Field of Classification Search

CPC .. H10P 70/234; H10P 14/6319; H10P 50/283; H10P 70/20; H10W 20/081

See application file for complete search history.

(56) References Cited

U.S. PATENT DOCUMENTS

| | | | | |
|---|---|---|---|---|
| 6,379,574 B1 | | 4/2002 | Ou-Yang | |
| 2009/0142931 A1 | * | 6/2009 | Wang | H10P 50/73 216/41 |
| 2009/0211596 A1 | * | 8/2009 | Yun | H10P 70/234 134/6 |

OTHER PUBLICATIONS

Iskenderova, K. (2003). Cleaning process in high density plasma chemical vapor deposition [Drexel University]. https://doi.org/10.17918/etd-344 (Year: 2003).*

A novel concept for contact etch residue removal, Ingrid Vos, 212 ECS Meeting, Abstract #1062, Jan. 2, 2024.

* cited by examiner

*Primary Examiner* — Matthew L Reames

(74) *Attorney, Agent, or Firm* — Reches Patents

(57) ABSTRACT

There is provided a method that includes (i) removing organic polymer residuals formed on a dry-etched hole that leads to a semiconductor structural element and coating the dry-etched hole with a non-organic polymer to provide a coated hole by exposing the dry-etched hole to a gaseous mixture, the gaseous mixture includes a fluorine based chemical compound, before the removing, the dry-etched hole was least partially coated with dry-etch residuals that comprise the organic polymer residuals; and (ii) coating the coated hole and removing fluorine based chemical compound residuals to provide an additionally coated hole by exposing the first coated hole to a nitrogen based plasma.

16 Claims, 3 Drawing Sheets

100

INCREASING Q-TIME

BACKGROUND OF THE INVENTION

Semiconductor wafers are manufactured by a highly complex manufacturing process that includes multiple stages. There is a time limitation between one stage to another. The time limitation is also known as Q-time.

One of the stages of the manufacturing process is dry etching. Dry etching leaves gaseous by-products on the wafer, and Q-time defects occur when the manufacturing stage that follows the dry etching is delayed.

The gaseous by-products may include organic polymers that may allow moisture and oxygen to pass through cracks formed, at least in part, during the dry etching and to cause Q-time failures.

In various cases the Q-time is very short (a few hours—for example—2 hours) and this negatively impacts the productivity and yield of the semiconductor wafers.

There is a growing need to provide a method for increasing the Q-time.

BRIEF DESCRIPTION OF THE DRAWINGS

The subject matter being regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DESCRIPTION OF THE PREFERRED EMBODIMENTS

According to an embodiment there is provided a method for post etch processing that once applied dramatically increases the Q-time following dry etching.

The method was used on a semiconductor region that included pre-metal dielectric (PMD) layers and a hole that was formed by dry etching.

Figure 1:
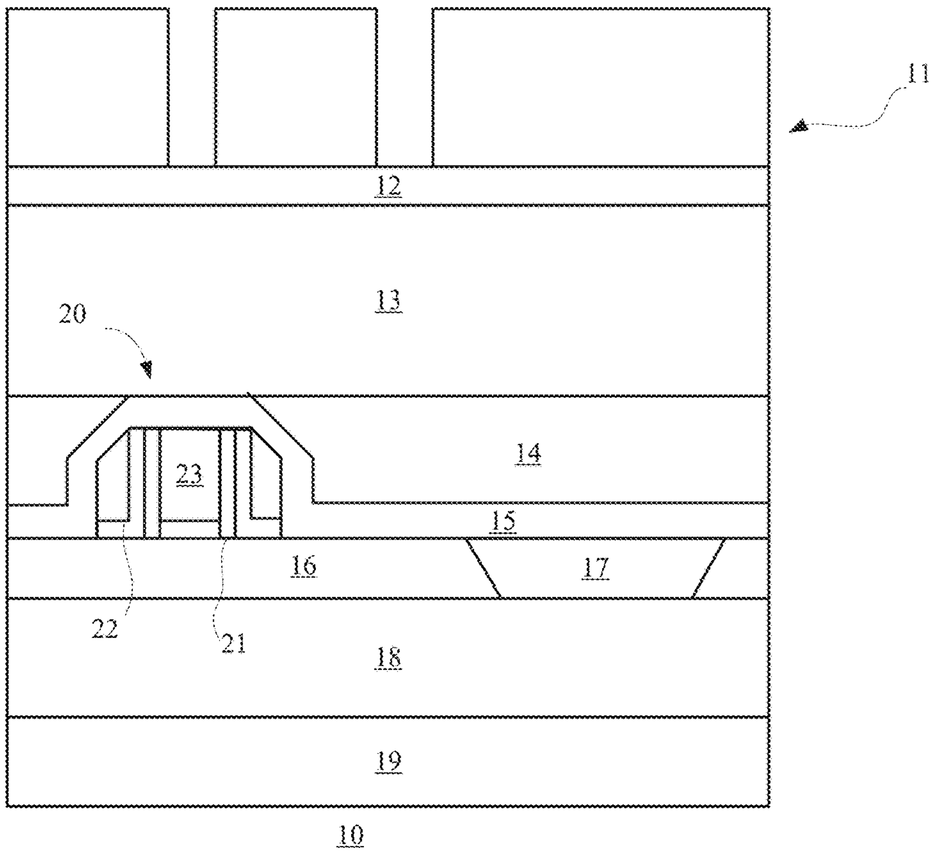
FIG. 1 illustrates an example of a semiconductor region.
Figure 1:
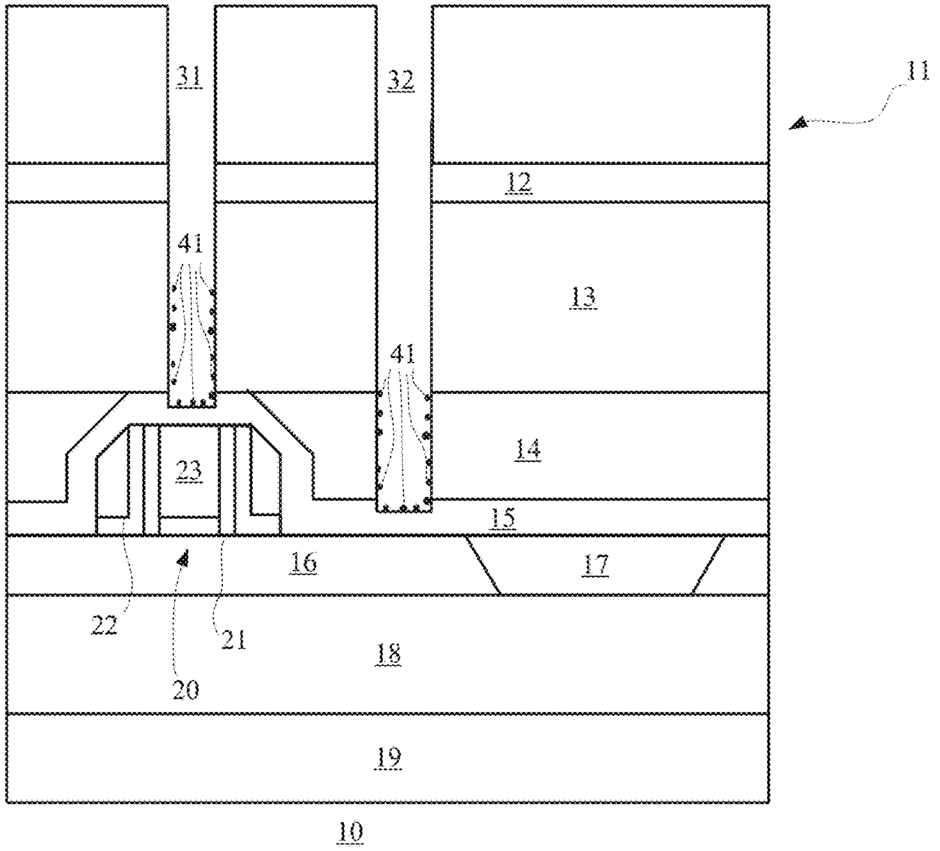

FIG. 1 illustrates an example of a semiconductor region 10 before a formation of dry-etched holes by a dry etching and following the formation of the dry-etched holes by the dry etching.

The semiconductor region (10) was fabricated using a 65 nm node flow and included a gate stack (23), spacers (21 and 22), and nickel silicide (NiPt) (not shown). Contact holes with a minimum dimension of 90 nm were patterned with 193 nm photoresist (11) (such as an ArF mask of initial thickness of 230 nm) on a stack of 66 nm plasma enhanced chemical vapor deposited (PECVD) process followed by a UV anneal that creates stressed SiN layer (15) of a 66 nm thickness, 105 nm high aspect ratio process (HARP) oxide (14), 315 nm (PECVD) TEOS (13), and 82 nm organic bottom anti-reflective coating (12) (BARC). The SiN layer of a 66 nm thickness was formed over a structural element (20) that included a gate of a transistor. FIG. 1 also illustrates a handle wafer (19), a BOX layer (18) on top of the handle wafer, a top silicon layer (16) on top of the BOX layer, and a shallow trench isolation (STI) (17) formed within the top silicon layer.

The dimensions mentioned above are merely examples of dimensions, other dimensions may be applied, other layers may be applied, and the like.

Following the dry etching—first dry-etched hole 31 and a second dry-etched hole 32 are formed. The first dry-etched hole 31 passes through at least a portion of the SiN layer (15) —above gate 23 (the first dry-etched hole 31 may or may not reach the gate).

The second dry-etched hole 31 passes through at least a portion of the SiN layer (15) —between the structural element and the STI.

Cracks formed in the HARP oxide (14) and/or the stressed SiN layer (15) could lead to a Q-time failure.

FIG. 1 also illustrates dry-etch residuals such as organic polymer residuals 41 within the first dry-etched hole 31 and a second dry-etched hole 32.

Figure 2:
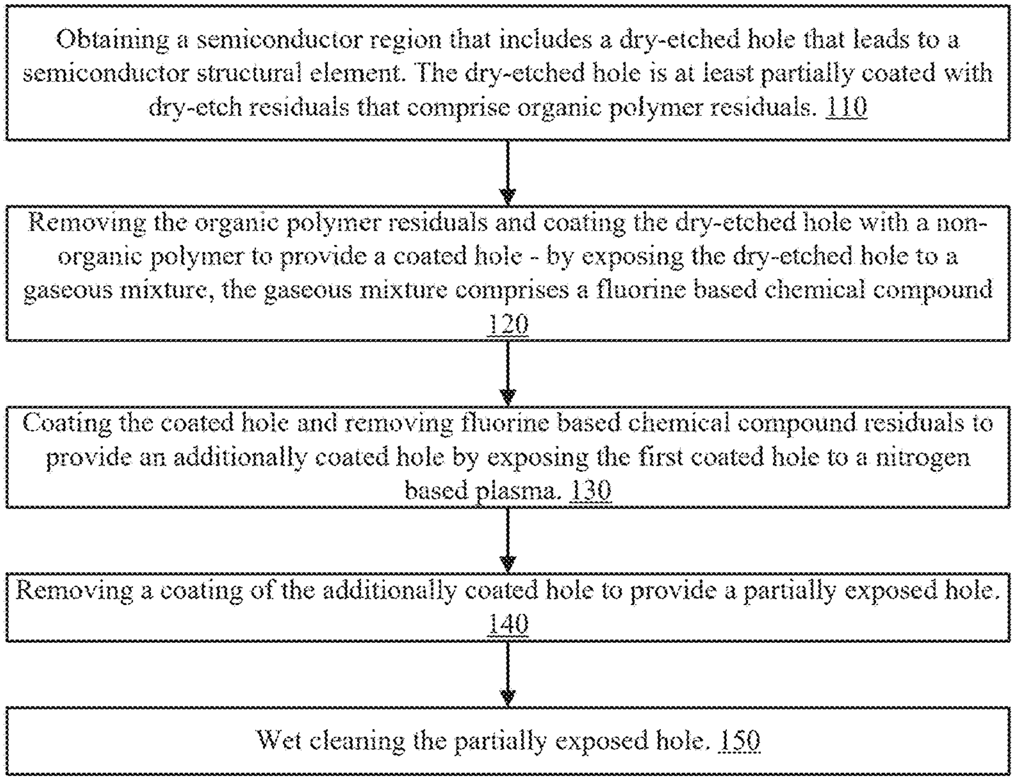
FIG. 2 illustrates an example of a method.

It should be noted that the method of FIG. 2 is applicable to other semiconductor regions.

FIG. 2 illustrates an example of method 100 for post etch processing.

According to an embodiment, method 100 includes step 110 of obtaining a semiconductor region that includes a dry-etched hole that leads to a semiconductor structural element. The dry-etched hole is at least partially coated with dry-etch residuals that comprise organic polymer residuals.

According to an embodiment, step 110 is followed by step 120 of removing the organic polymer residuals and coating the dry-etched hole with a non-organic polymer to provide a coated hole—by exposing the dry-etched hole to a gaseous mixture, the gaseous mixture comprises a fluorine based chemical compound.

According to an embodiment, step 120 includes exposing the dry-etched hole with a gaseous mixture of oxygen (O2) and carbon tetrafluoride (CF4) using plasma, at 560/40 standard cubic centimeter per minute (sccm), at a temperature of 50 degree Celsius, at a pressure of 25 millitorr, at a plasma having power of 300 W and for a duration of 10 seconds.

According to an embodiment, step 120 is followed by step 130 of coating the coated hole and removing fluorine based chemical compound residuals to provide an additionally coated hole by exposing the first coated hole to a nitrogen based plasma.

According to an embodiment, step 130 includes exposing the coated hole to a mixture of Nitrogen (N2) and Hydrogen (H2) at 300/100 sccm, at a temperature of 50 degree Celsius, at a pressure of 100 millitorr, at a power of 200 W and for a duration of 30 seconds.

According to an embodiment, the coating formed by step 130 seals the bottom and a sidewall of the additionally coated hole.

According to an embodiment, the fluorine based chemical compound is carbon tetrafluoride (CF4).

According to an embodiment, the fluorine based chemical compound is Perfluorocyclobutene (C4F6).

According to an embodiment, the fluorine based chemical compound is Octafluorocyclobutane (C4F8).

According to an embodiment, the fluorine based chemical compound is Fluoroform (CHF3).

According to an embodiment, the fluorine based chemical compound is Difluoromethane (CH2F2).

According to an embodiment, the fluorine based chemical compound is Methyl fluoride (CH3F).

According to an embodiment, the fluorine based chemical compound comprises one or more fluorine atoms and one or more carbon atoms.

According to an embodiment, the gaseous mixture further comprises oxygen.

According to an embodiment, the duration of step 120 is less than a half of a duration of step 130.

According to an embodiment, a combined duration of step 120 and step 130 is less than a minute.

According to an embodiment, step 120 starts immediately after a completion of a dry etching process that formed the dry-etched hole.

According to an embodiment, step 130 replaces a wet cleaning of the coated hole.

According to an embodiment, method 100 further includes step 140 of removing a coating of the additionally coated hole to provide a partially exposed hole, and step 150 of wet cleaning the partially exposed hole.

According to an embodiment, the semiconductor region comprises pre-metal dielectric (PMD) layers.

According to an embodiment, the semiconductor region is a silicon on oxide (SOI) semiconductor region (layer).

Figure 3:
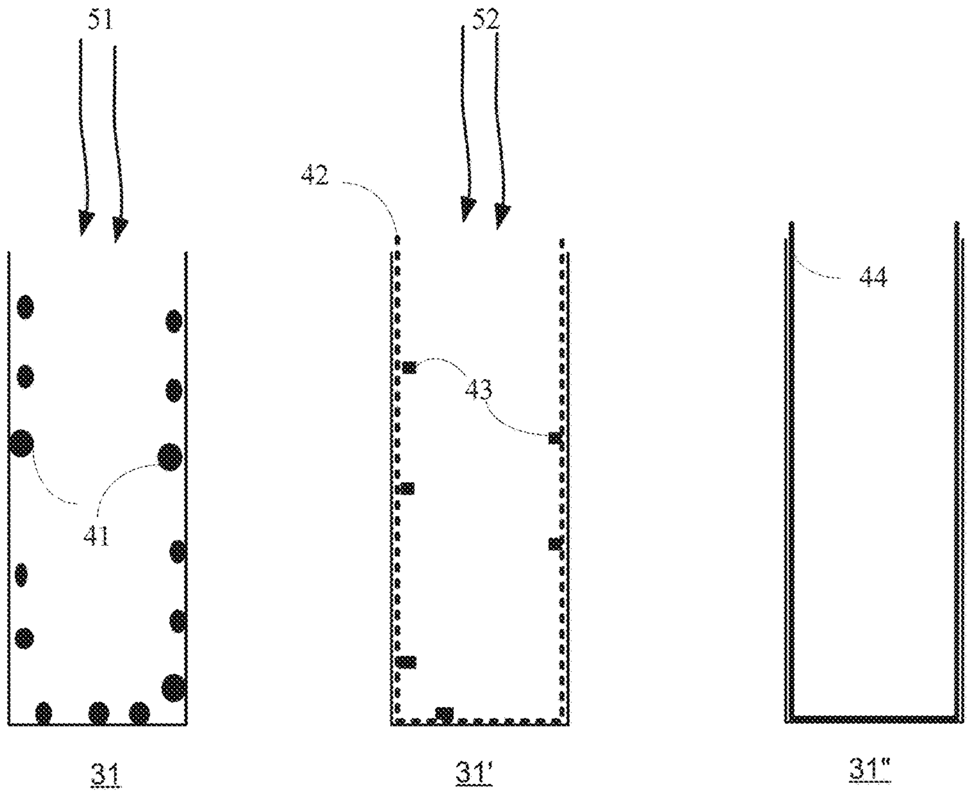
FIG. 3 illustrates an example of holes.

FIG. 3 illustrates an example of holes.

FIG. 3 illustrates (from left to right):

a. First dry etched hole 31 that includes organic polymer residuals 41.

b. Applying step 120 (represented by arrows 51) on the first dry etched hole to provide coated hole 31'.

c. Coated hole 31' that has its bottom and sidewall at least partially coated by a non-organic polymer 42 and also including fluorine based chemical compound residuals 43 (resulted from applying step 120).

d. Applying step 130 (represented by arrows 52) on the coated hole 31' to provide additionally coated hole 31".

e. Additionally coated hole 31" that had the fluorine based chemical compound residuals removed and has a more significant coating 44—that may form a sealing layer.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

In the foregoing detailed description, numerous specific details are set forth to provide a thorough understanding of the invention. However, it will be understood by those skilled in the art that the present invention may be practiced without these specific details. In other instances, well-known methods, procedures, and components have not been described in detail so as not to obscure the present invention.

The subject matter being regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

The term "and/or" means additionally or alternatively. For example—A and/or B—may mean only A, only B, or both A and B.

Any reference to any of the terms "comprise", "comprises", "comprising" "including", "may include" and "includes" may be applied, mutatis mutandis, to any of the terms "consists", "consisting", "consisting essentially of".

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps than those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A method for post etch processing, the method comprising:

(a) obtaining a semiconductor region that comprises a dry-etched hole that leads to a semiconductor structural element, the dry-etched hole is at least partially coated with dry-etch residuals that comprise organic polymer residuals;

(b) removing the organic polymer residuals, and coating the dry-etched hole with a non-organic polymer to provide a coated hole by exposing the dry-etched hole to a gaseous mixture, the gaseous mixture comprises a fluorine based chemical compound; and (c) coating the coated hole and removing fluorine based chemical compound residuals to provide an additionally coated hole by exposing the first coated hole to a nitrogen based plasma.

2. The method according to claim 1, wherein the coating of the coated hole seals a bottom and a sidewall of the coated hole.

3. The method according to claim 1, wherein the coating of the additionally coated hole provides a humidity barrier between the coated hole and at least one of a silicon nitride (SiN) layer or an oxide layer located below the coated hole.

4. The method according to claim 1, wherein the SiN layer exhibits a thickness that ranges between 40 to 70 nanometers.

5. The method according to claim 1, wherein the oxide layer is a high aspect ratio process (HARP) process oxide layer.

6. The method according to claim 1, wherein the fluorine based chemical compound is carbon tetrafluoride (CF4).

7. The method according to claim 1, wherein the fluorine based chemical compound is selected out of Perfluorocyclobutene (C4F6), Octafluorocyclobutane (C4F8), Fluoroform (CHF3), Difluoromethane (CH2F2) or Methyl fluoride (CH3F).

8. The method according to claim 1, wherein the fluorine based chemical compound comprises one or more fluorine atoms and one or more carbon atoms.

9. The method according to claim 1, wherein the gaseous mixture further comprises oxygen.

10. The method according to claim 1, wherein a duration of step (a) is less than a half of a duration of step (b).

11. The method according to claim 1, wherein a combined duration of step (a) and step (b) is less than a minute.

12. The method according to claim 1, wherein step (b) starts immediately after a completion of a dry etching process that formed the dry-etched hole.

13. The method according to claim 1, wherein the semiconductor region comprises pre-metal dielectric (PMD) layers.

14. The method according to claim 1, wherein the semiconductor region is a silicon on oxide (SOI) semiconductor region.

15. The method according to claim 1, wherein the coating of the coated hole replaces a wet cleaning of the coated hole.

16. The method according to claim 1, further comprising removing a coating of the additionally coated hole to provide a partially exposed hole and wet cleaning the partially exposed hole.

* * * * *